(12) United States Patent
Macaraeg et al.

(10) Patent No.: US 10,149,387 B2
(45) Date of Patent: Dec. 4, 2018

(54) ACTIVE COMPOSITE PANEL ASSEMBLIES, SYSTEMS, AND METHODS

(71) Applicant: THE BOEING COMPANY, Chicago, IL (US)

(72) Inventors: Sesinando P. Macaraeg, Everett, WA (US); Nathanial C. Cuddy, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/131,087

(22) Filed: Apr. 18, 2016

(65) Prior Publication Data
US 2017/0303402 A1   Oct. 19, 2017

(51) Int. Cl.
| | | |
|---|---|---|
| *H05K 1/02* | (2006.01) | |
| *H05K 1/11* | (2006.01) | |
| *H05K 1/18* | (2006.01) | |
| *H05K 3/20* | (2006.01) | |
| *H05K 3/32* | (2006.01) | |
| *B29C 70/86* | (2006.01) | |
| *B64C 1/06* | (2006.01) | |
| *H02G 3/00* | (2006.01) | |
| *B64C 1/00* | (2006.01) | |
| *B64D 11/00* | (2006.01) | |

(52) U.S. Cl.
CPC .............. *H05K 1/182* (2013.01); *B29C 70/86* (2013.01); *B64C 1/066* (2013.01); *H05K 1/0213* (2013.01); *H05K 1/11* (2013.01); *H05K 3/20* (2013.01); *H05K 3/32* (2013.01); *B32B 2307/202* (2013.01); *B64C 2001/0072* (2013.01); *B64D 2011/0046* (2013.01); *B64D 2221/00* (2013.01); *H02G 3/00* (2013.01)

(58) Field of Classification Search
CPC ........ H05K 1/182; H05K 1/0213; H05K 1/11; H05K 3/32; H05K 3/20
See application file for complete search history.

(56) References Cited

U.S. PATENT DOCUMENTS

| | | | | |
|---|---|---|---|---|
| 7,283,095 | B2 * | 10/2007 | Karanik | H01Q 9/0407 |
| | | | | 343/700 MS |
| 7,434,480 | B2 * | 10/2008 | Georgeson | G01B 7/20 |
| | | | | 73/776 |
| 7,857,484 | B2 * | 12/2010 | Marshall | F21K 9/00 |
| | | | | 362/249.01 |
| 2003/0038610 | A1 * | 2/2003 | Munshi | H02J 7/35 |
| | | | | 320/101 |

(Continued)

FOREIGN PATENT DOCUMENTS

| | | |
|---|---|---|
| DE | 20 2009 018070 | 4/2011 |
| WO | WO 2009/029457 | 3/2009 |

OTHER PUBLICATIONS

Extended European Search Report for EP 17165475.9-1754, dated Aug. 25, 2017.

*Primary Examiner* — Nathan Milakovich
(74) *Attorney, Agent, or Firm* — Joseph M. Butscher; The Small Patent Law Group, LLC (57) ABSTRACT

An active composite panel assembly is configured to transfer electrical signals from a source to an electrical device. The active composite panel assembly includes a composite layer, and an active layer secured to the composite layer. The active layer is configured to receive and conduct the electrical signals.

20 Claims, 7 Drawing Sheets

(56) References Cited

U.S. PATENT DOCUMENTS

| | | | |
|---|---|---|---|
| 2009/0045195 A1* | 2/2009 | Djerf | B65D 65/40 |
| | | | 220/62.11 |
| 2009/0047453 A1* | 2/2009 | Folaron | B61D 49/00 |
| | | | 428/34.1 |
| 2009/0047502 A1* | 2/2009 | Folaron | B32B 5/26 |
| | | | 428/327 |
| 2010/0213312 A1 | 8/2010 | Robb | |
| 2011/0256455 A1* | 10/2011 | Coowar | H01G 9/02 |
| | | | 429/247 |
| 2012/0012703 A1 | 1/2012 | Schmid | |
| 2012/0064285 A1* | 3/2012 | Mathur | B32B 3/12 |
| | | | 428/116 |
| 2015/0232165 A1 | 8/2015 | Staudigel | |
| 2015/0286359 A1* | 10/2015 | Oakley | G06F 1/1637 |
| | | | 345/173 |
| 2015/0331296 A1* | 11/2015 | Mennig | B32B 17/10174 |
| | | | 359/296 |
| 2017/0217389 A1* | 8/2017 | Macaraeg | B60R 16/033 |

* cited by examiner

ACTIVE COMPOSITE PANEL ASSEMBLIES, SYSTEMS, AND METHODS

FIELD OF THE DISCLOSURE

Embodiments of the present disclosure generally relate to composite panel assemblies, and more particularly, to active composite panel assemblies, systems, and methods that are configured to transfer electrical signals (such as power and/or data signals) to electrical devices.

BACKGROUND OF THE DISCLOSURE

In various applications, electrical signals (such as power and/or data signals) are transferred from a source to one or more electrical devices. For example, an interior cabin of an aircraft includes numerous signs, displays, and the like that receive power and/or data signals in order to operate.

Typically, an electrical device secured within an internal cabin of an aircraft is connected to surface mounted or embedded electrical wiring. In short, the electrical device is connected to a source of power or data through wiring, circuits, conduits, raceways, and/or the like. Wiring is typically routed from the electrical device to the source. In general, wiring is routed to and connected to each electrical device within an internal cabin. In some instances, portions of panels are removed to accommodate and route wiring to devices mounted on the panels.

As can be appreciated, in order to accommodate the various electrical devices onboard an aircraft, large amounts of electrical wiring may be used. During manufacture of the aircraft, the processes of connecting the electrical devices to the wiring, and routing the wiring through the aircraft are typically time and labor intensive. Moreover, the wiring, associated routing infrastructure, and attachment hardware add weight and complexity to the aircraft, which may decrease fuel efficiency during operation.

SUMMARY OF THE DISCLOSURE

A need exists for a system and method for efficiently connecting electrical devices to a source, such as a power and/or data source. A need exists for a system and method for reducing the amount of electrical wiring and/or circuit boards within a structure, device, component, vehicle, such as an aircraft, and/or the like.

With those needs in mind, certain embodiments of the present disclosure provide an active composite panel assembly that is configured to transfer electrical signals from a source to an electrical device. The active composite panel assembly includes a composite layer, and an active layer secured to the composite layer. The active layer is configured to receive and conduct the electrical signals.

The active layer may include one or more of a conductive nano-grid arranged in a pattern, conductive nano-wires, conductive nano-particles, conductive fibers, thin film transistors, switches, conductive films, conductive filaments, conductive strands, and/or the like.

A conductive substrate may be secured to the active layer opposite from the composite layer. A cover may be positioned over the active layer. The cover may be formed of one or more of laminate, plastic, or glass. In at least one embodiment, a channel is formed through the cover. The channel may be sized and shaped to receive at least a portion of the electrical device.

In at least one embodiment, the active composite panel assembly includes the electrical device, which is electrically coupled to the active layer. The electrical device may be embedded within the active composite panel assembly. In at least one other embodiment, the electrical device is mounted onto a portion of the active composite panel assembly.

The active composite panel assembly may also include a signal transfer medium that extends through a portion of the composite layer and couples the active layer to one or both of an electrical connector or an electrical source.

Certain embodiments of the present disclosure provide a method of forming an active composite panel assembly that is configured to transfer electrical signals from a source to an electrical device. The method includes providing a composite layer, and securing an active layer to the composite layer. The active layer is configured to receive and conduct the electrical signals.

The method may also include securing a conductive substrate to the active layer opposite from the composite layer. The method may also include positioning a cover over the active layer. In at least one embodiment, the method may include forming a channel through the cover.

The method may include positioning the electrical device on or in the active composite panel assembly, and electrically coupling the electrical device to the active layer. The positioning operation may include embedding the electrical device within the active composite panel assembly. In at least one other embodiment, the positioning operation includes mounting the electrical device onto a portion of the active composite panel assembly.

The method may include positioning a signal transfer medium through a portion of the composite layer, coupling the active layer to the signal transfer medium, and coupling the signal transfer medium to one or both of an electrical connector or an electrical source.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular condition may include additional elements not having that condition.

Certain embodiments of the present disclosure provide an active composite panel assembly that includes an active layer that is configured to conduct electrical signals, such as power and data signals. The active layer provides an actively charged or otherwise conductive layer within the active composite panel assembly, which allows for the placement of electrical devices to be connected to the panel and receive the electrical signals. In at least one embodiment, the active layer may include a matrix layer that may be mapped to detect resistances on the surface of the active composite panel assembly. The resistances may be controlled with a logic map to control transmission of the electrical signals to the electrical device. In at least one embodiment, the active layer may include an active matrix layer that may be mapped with an internal or external logic controller that determines, directs, and/or controls the electrical signals to a discrete location or electrical device.

Embodiments of the present disclosure provide systems, methods, and assemblies that eliminate, minimize, or otherwise reduce hidden wiring within composite panels. Embodiments of the present disclosure are configured to replace, eliminate, minimize, or otherwise reduce wiring that would otherwise be routed through a composite panel, for example.

Embodiments of the present disclosure provide systems, methods, and assemblies that may eliminate, minimize, or otherwise reduce hard wire, circuits, conduits, and/or the like within a composite panel. An electrical device may be connected to an active composite panel assembly such that electrical contacts of the device are coupled to an active layer, thereby allowing electrical signals to be transferred to the device.

The active layer of the active composite panel assembly is used to transport or otherwise transfer electrical signals, such as power and/or data signals, to an electrical device coupled to the active composite panel assembly. In at least one embodiment, the active composite panel assembly includes an active layer (such as an active matrix) that is configured to transport electrical signals. The active composite panel assembly may also include a connector (such as a power and/or data connector) and a signal transfer medium (such as a flat cable, wire, or the like) that couples the connector to the active layer. A cover (such as a laminate, glass layer, or the like) may be positioned over the active layer.

Figure 1:
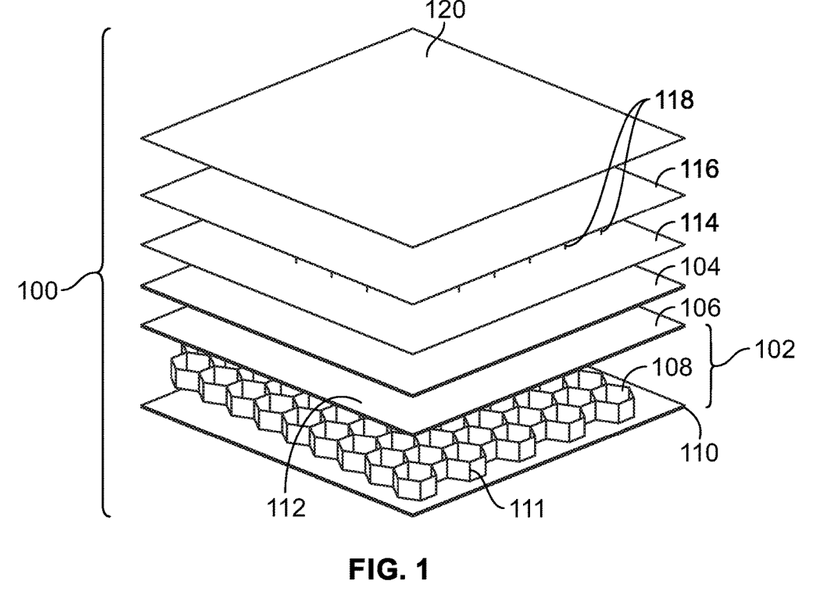
FIG. 1 is a diagrammatic representation of a perspective exploded front view of an active composite panel assembly, according to an embodiment of the present disclosure.

FIG. 1 is a diagrammatic representation of a perspective exploded front view of an active composite panel assembly 100, according to an embodiment of the present disclosure. The active composite panel assembly 100 includes a composite layer 102 and an active layer 104. The active layer 104 may be positioned over (or under) the composite layer 102. In at least one embodiment, the active layer 104 may cover an entire upper surface 106 of the composite layer 102. Optionally, the active layer 104 may cover less than the entire upper surface 106.

The active layer 104 may be secured to the composite layer 102 through a conductive adhesive, for example. In at least one other embodiment, the active layer 104 may be secured to the composite layer 102 through one or more conductive fasteners. In at least one other embodiment, the active layer 104 may be positioned over the composite layer 102 and encapsulated or otherwise covered with a securing film, wrap, adhesive, or the like having at least a portion that is conductive.

A signal transfer medium (not shown in FIG. 1) may extend through a portion of the composite layer 102. For example, the signal transfer medium may be ribbon cable that linearly extends through the composite layer 102 from a bottom surface to a top surface (or vice-versa). The signal transfer medium couples the active layer 104 to a connector, such as a power and/or signal connector, which electrically connects the active composite panel assembly 100 to a source, such as a power source and/or data source. In at least one other embodiment, the signal transfer medium couples the active layer 104 directly to the source without a separate and distinct connector.

The composite layer 102 may include a core 108 sandwiched between opposed first and second skins 110 and 112. The core 108 may include a plurality of interconnected honeycomb cells 111. In at least one other embodiment, the core may be a solid layer or porous foam layer. The core 108 may be formed of aramid fibers, and/or polyamides, for example. The first and second skins 110 and 112 may be or include one or more pre-impregnated epoxy resin layers that include fibers, such as fiberglass, graphite, Kevlar, and/or the like. The first and second skins 110 and 112 may be identical to one another. In at least one other embodiment, the first and second skins 110 and 112 may include more or less layers than one another.

The active layer 104 may be or include one or more sheets of a conductive nano-grid arranged in a pattern, conductive nano-wires, conductive nano-particles, conductive fibers, thin film transistors, switches, conductive films, conductive filaments, conductive strands, and/or other types of substrates that are configured to allow electrical signals to be transferred therethrough. In at least one embodiment, the active layer 104 may be a sheet, panel, or other such substrate that includes silver nano-wires, conductive filaments, thin film transistors, and/or the like. When connected to a source of electrical power, the entire active layer 104 may be energized. The power signals may be transferred from a power source through the active layer 104. In a similar manner, data signals may be transferred through the active layer 104. In at least one embodiment, the active layer 104 may include defined areas, such as grids, cells, transistors, switches, and/or the like, in which electrical signals may be routed through a control unit. For example, electrical signals (such as power and/or data signals) may be controlled and delivered to various distinct locations of the active layer 104.

As shown, the active layer 104 is positioned over the composite layer 102. In at least one other embodiment, the active layer 104 may be positioned under or to a side of the composite layer 102. That is, the orientation of the active composite panel assembly 100 shown in FIG. 1 may be inverted, rotated, and/or the like.

A conductive substrate 114 may be positioned over the active layer 104 opposite from the composite layer 102. The conductive substrate 114 may be or include one or more sheets of conductive material that allow electrical signals to pass therethrough. As shown, the active layer 104 may be sandwiched between the composite layer 102 and the conductive substrate 114. In at least one other embodiment, the active composite panel assembly 100 may not include the conductive substrate 114.

An electrical device 116 is positioned over the conductive substrate 114. The electrical device 116 may include one or more conductive contacts 118 (such as conductive pins, tails, plugs, leads, or other such electrical contacts) that conductively connect to the conductive substrate 114. Optionally, as noted above, the active composite panel assembly 100 may not include the conductive substrate 114, in which case the contacts 118 may conductively and directly connect to the active layer 104.

As shown, the electrical device 116 may be embedded within the active composite panel assembly 100. In at least one other embodiment, the electrical device 116 may be mounted onto the active composite panel assembly 100. In at least one other embodiment, the electrical device 116 may be coupled to the active composite panel assembly 100, such as through a cable, for example.

The electrical device 116 may be or include one or more lights (such as light emitting diodes), a graphic or video display (such as an organic light emitting diode panel, sheet, screen or the like), an audio device (such as one or more speakers), an electrical connector (such as an outlet into which another electrical device may connect to, such as through a plug), a heater, a cooling unit, and/or the like.

The active composite panel assembly 100 may also include a cover 120 positioned over the electrical device 116. The cover 120 may be a laminate sheet, for example. In at least one embodiment, the cover 120 may be a decorative laminate sheet that covers the electrical device. In at least one other embodiment, the cover 120 may be a sheet of plastic, glass, Plexiglas, and/or the like. Alternatively, the active composite panel assembly 100 may not include the cover 120.

The active composite panel assembly 100 may be shaped as a flat, planar piece, as shown in FIG. 1. It is to be understood, however, that the active composite panel assembly 100 may be shaped as various other shapes, such as those having bends, cants, curves, and/or the like. For example, the active composite panel assembly 100 may be shaped as a tubular or semi-tubular structure. The active composite panel assembly 100 may be regularly or irregularly shaped.

The components of the active composite panel assembly 100 may be securely sandwiched together through one or more adhesives, fasteners, wraps, films, and/or the like.

In operation, electrical signals (such as power and/or data signals) are transferred to the active composite panel assembly 100 from a source. The electrical signals are transferred to the active layer 104 through the signal transfer medium (not shown in FIG. 1) that extends through a portion of the composite layer 102. Optionally, the signal transfer medium may be positioned around a portion of the composite layer 102 (instead of passing therethrough). Because the active layer 104 is conductive, the active layer 104 allows the electrical signals to pass. When coupled to a source of electrical power, for example, the entire active layer 104 may be energized and conduct the electrical signals. The electrical signals are transferred to the electrical device 116 through the active layer 104. In this manner, the electrical device 116 may be powered and/or data signals transferred therethrough without the use of a plurality of wires and conduits being routed through and/or secured on the composite layer 102.

Figure 2:
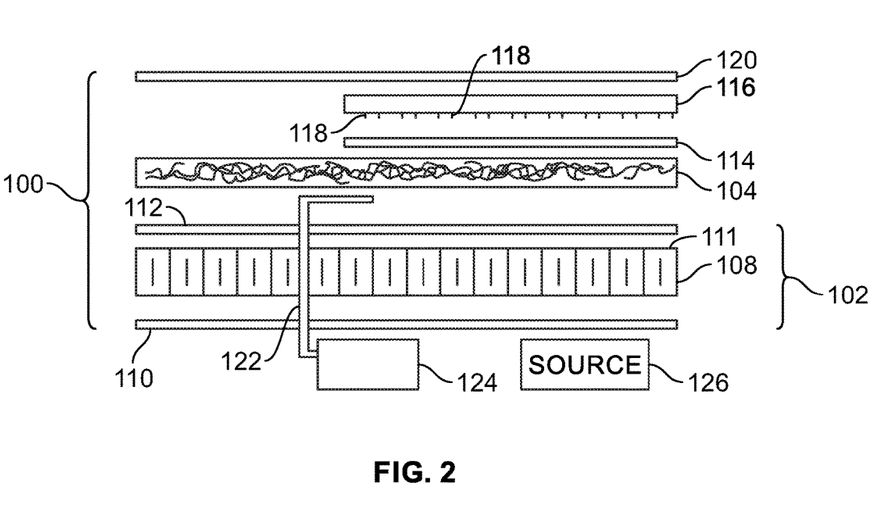
FIG. 2 is a diagrammatic representation of a lateral exploded view of an active composite panel assembly, according to an embodiment of the present disclosure.

FIG. 2 is a diagrammatic representation of a lateral exploded view of the active composite panel assembly 100, according to an embodiment of the present disclosure. As shown, the signal transfer medium 122 may extend through the composite layer 102 and electrically couple the active layer 104 to a connector 124. Optionally, the signal transfer medium 122 may extend around an outer portion (such as an edge) of the composite layer 102. The signal transfer medium 122 may be or include a flat wire harness or flat cable (such as ribbon wire). In at least one other embodiment, the signal transfer medium 122 may be or include one or more wires, cables, or the like. The connector 124 may be a power or data connector that couples the active composite panel assembly 100 to a source 126, such as a power source and/or a data source (for example, a computer, one or more processors, and/or the like). For example, the connector 124 may be an outlet or plug that removably couples to a reciprocal component that connects to the source 126. In at least one other embodiment, the signal transfer medium 122 may directly connect to the source 126 without the separate and distinct connector 124.

As shown, the electrical device 116 may be embedded within the active composite panel assembly 100. The electrical device 116 may include more or less conductive contacts 118 than shown. The contacts 118 may be pins, plugs, and/or the like. In at least one other embodiment, the electrical device 116 may not include separate and distinct contacts, but may be configured to receive electrical signals from the active layer 104 by being in close proximity thereto, such as by abutting into a surface of the active layer 104.

Optionally, the electrical device 116 may be mounted on the active composite panel assembly 100, such as over the cover 120. In at least one other embodiment, the electrical device 116 may be remotely located from the active composite panel assembly 100, and connected thereto through a cable, for example.

Figure 3:
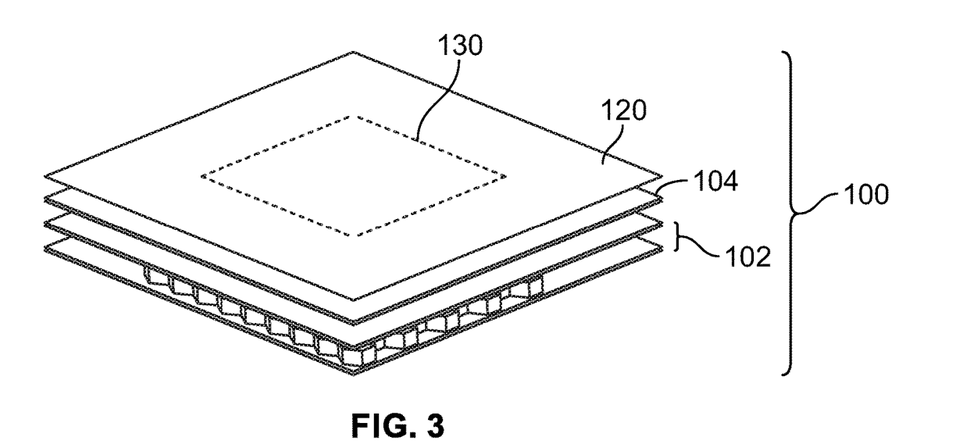
FIG. 3 is a diagrammatic representation of a perspective exploded front view of an active composite panel assembly, according to an embodiment of the present disclosure.

FIG. 3 is a diagrammatic representation of a perspective exploded front view of the active composite panel assembly 100, according to an embodiment of the present disclosure. In this embodiment, a channel 130 is formed through the cover 120 to expose a portion of the active layer 104. An electrical device (not shown in FIG. 1) may mount to the active composite panel assembly 100 such that contacts are coupled to the active layer 104 (and/or a conductive substrate) through the channel 130.

The channel 130 may be sized and shaped to accommodate an electrical device of a specific size and shape. For example, the electrical device may be a light panel, and the channel 130 may be sized to allow the light panel to fit therein. The channel 130 may be formed of various shapes and sizes other than shown. Further, additional channels may be formed through the cover 120.

The electrical device may be securely mounted to the active composite panel assembly 100 through adhesives, fasteners, and/or the like. Optionally, the electrical device may be securely mounted to the active composite panel assembly 100 by way of the contacts of the electrical device being retained within reciprocal members (such as plated conductive through-holes) formed through the conductive substrate 114 (shown in FIGS. 1 and 2) and/or the active layer 104. In at least one other embodiment, a conductive adhesive may be applied between interfacing surfaces of the electrical device and the active layer 104.

Figure 4:
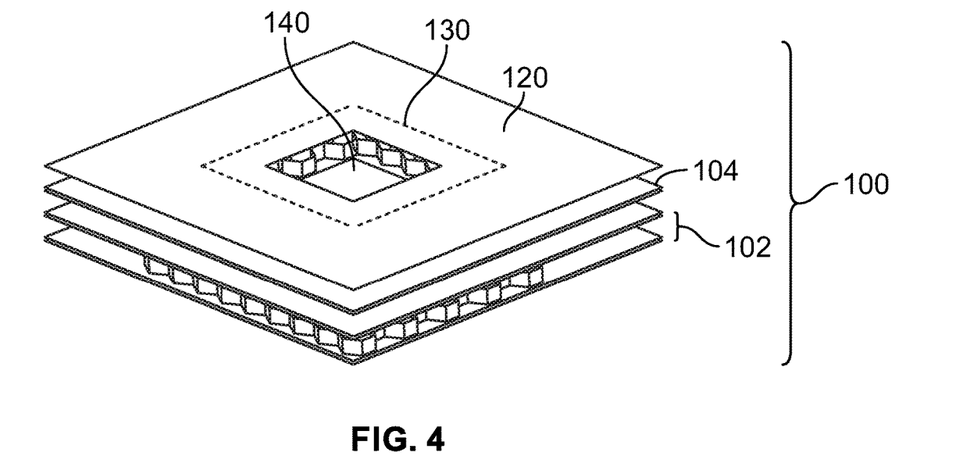
FIG. 4 is a diagrammatic representation of a perspective exploded front view of an active composite panel assembly, according to an embodiment of the present disclosure.

FIG. 4 is a diagrammatic representation of a perspective exploded front view of the active composite panel assembly 100, according to an embodiment of the present disclosure. In this embodiment, in addition to the channel 130 being formed through the cover 130, a passage 140 may be formed through the active layer 104 and the composite layer 102. The passage 140 is configured to accommodate a signal transfer medium, a connector, a structural portion of an electrical device, and/or the like. The composite panel assembly 100 may include additional passages formed therethrough. Further, the passage 140 may be smaller or larger than shown.

Referring to FIGS. 1-4, the active composite panel assembly 100 may be secured within or on various structures. For example, an internal cabin of a vehicle, such as a commercial aircraft, may include numerous active composite panel assemblies 100, such as on walls, ceilings, floors, monuments, barriers, and/or the like. Further, the active composite panel assembly 100 may be used on exterior surfaces of a vehicle, such as on or within wings, outer surfaces of fuselages, cargo panels, engines, and/or the like. Further, the active composite panel assembly 100 may be used on or within fixed structures, such as buildings (residential and commercial), and/or the like. For example, a plurality of composite panel assemblies 100 may form walls, ceilings, floors, partitions, dividers, and the like within various structures. As such, the portions of the structures may be configured to transfer electrical signals to electrical devices coupled thereto.

Figure 5:
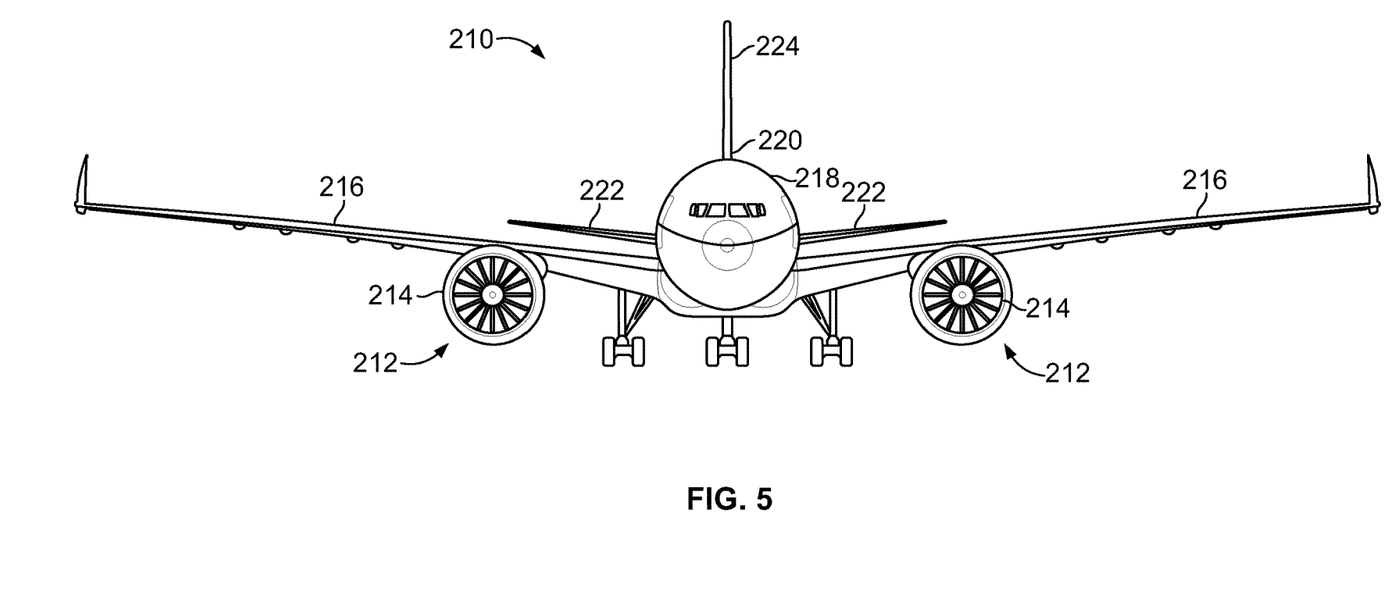
FIG. 5 is a diagrammatic representation of a front view of an aircraft, according to an embodiment of the present disclosure.

FIG. 5 is a diagrammatic representation of a front view of an aircraft 210 (or aircraft assembly), according to an embodiment of the present disclosure. The aircraft 210 includes a propulsion system 212 that may include two turbofan engines 214, for example. Optionally, the propulsion system 212 may include more engines 214 than shown. The engines 214 are carried by wings 216 of the aircraft 210. In other embodiments, the engines 214 may be carried by a fuselage 218 and/or an empennage 220. The empennage 220 may also support horizontal stabilizers 222 and a vertical stabilizer 224.

The fuselage 218 of the aircraft 210 defines an internal cabin, which may include a cockpit, one or more work sections (for example, galleys, personnel carry-on baggage areas, and the like), and one or more passenger sections (for example, first class, business class, and coach sections). Each of the sections may be separated by a cabin transition area, which may include one or more class divider assemblies. Overhead stowage bin assemblies may be positioned throughout the internal cabin. Various exterior portions of the aircraft 210, such as exterior portions shown and/or interior portions within an internal cabin, may be formed of one or more active composite panel assemblies 100 (shown in FIGS. 1-4).

Figure 6A:
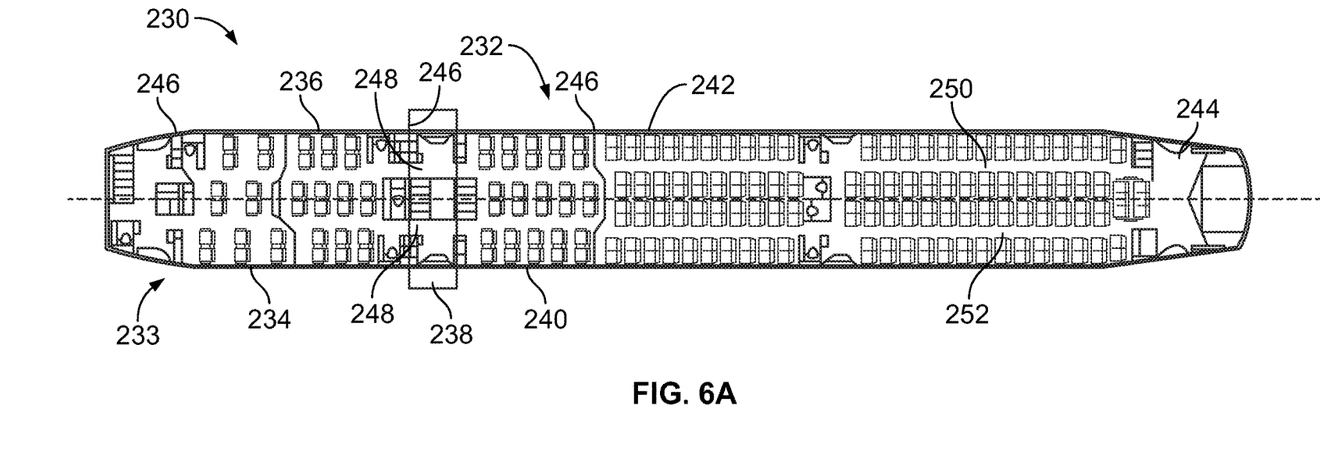
FIG. 6A is a diagrammatic representation of a top plan view of an internal cabin of an aircraft, according to an embodiment of the present disclosure.

FIG. 6A is a diagrammatic representation of a top plan view of an internal cabin 230 of an aircraft, according to an embodiment of the present disclosure. The internal cabin 230 may be within a fuselage 232 of the aircraft. For example, one or more fuselage walls may define the internal cabin 230. The internal cabin 230 includes multiple sections, including a front section 233, a first class section 234 (or first class suites, cabins, for example), a business class section 236, a front galley station 238, an expanded economy or coach section 240, a standard economy or coach section 242, and an aft section 244, which may include multiple lavatories and galley stations. It is to be understood that the internal cabin 230 may include more or less sections than shown. For example, the internal cabin 230 may not include a first class section, and may include more or less galley stations than shown. Each of the sections may be separated by a cabin transition area 246, which may include class divider assemblies between aisles 248.

As shown in FIG. 6A, the internal cabin 230 includes two aisles 250 and 252 that lead to the aft section 244. Optionally, the internal cabin 230 may have more or less aisles than shown. For example, the internal cabin 230 may include a single aisle that extends through the center of the internal cabin 230 that leads to the aft section 244.

Figure 6B:
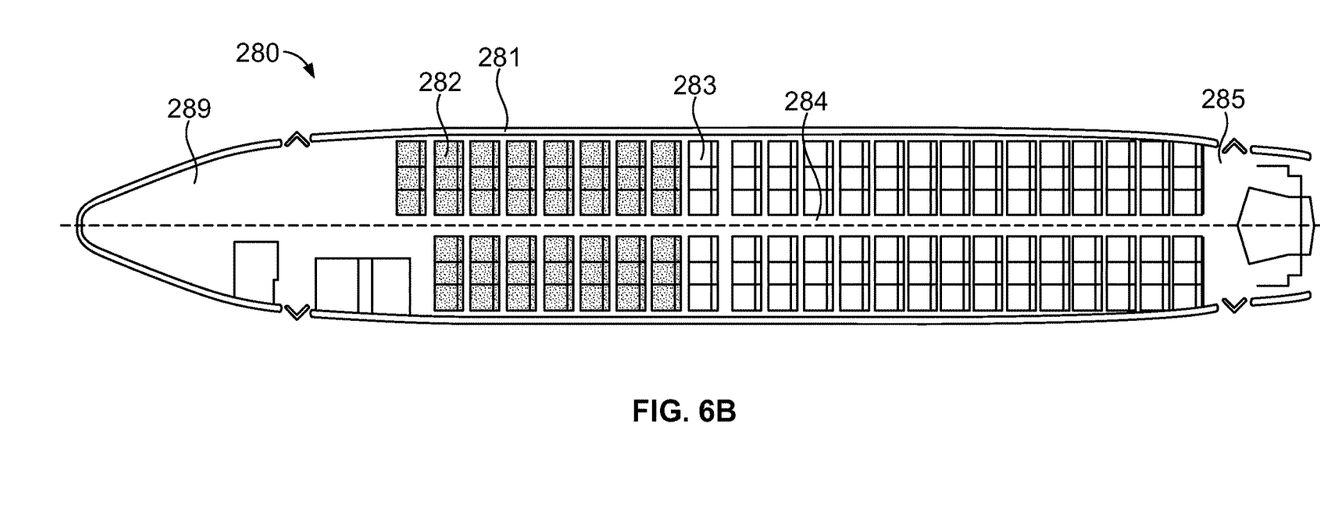
FIG. 6B is a diagrammatic representation of a top plan view of an internal cabin of an aircraft, according to an embodiment of the present disclosure.

FIG. 6B is a diagrammatic representation of a top plan view of an internal cabin 280 of an aircraft, according to an embodiment of the present disclosure. The internal cabin 280 may be within a fuselage 281 of the aircraft. For example, one or more fuselage walls may define the internal cabin 280. The internal cabin 280 includes multiple sections, including a cockpit 289, a main cabin 282 having passenger seats 283, and an aft section 285 behind the main cabin 282. It is to be understood that the internal cabin 280 may include more or less sections than shown.

The internal cabin 280 may include a single aisle 284 that leads to the aft section 285. The single aisle 284 may extend through the center of the internal cabin 280 that leads to the aft section 285. For example, the single aisle 284 may be coaxially aligned with a central longitudinal plane of the internal cabin 280.

Referring to FIGS. 6A and 6B, various portions within an internal cabin of an aircraft may be formed of one or more active composite panel assemblies 100 (shown in FIGS. 1-4). For example, interior walls that define the internal cabin may be formed of one or more active composite panel assemblies 100. Portions of seats within the internal cabin may be formed of one or more active composite panel assemblies 100. Doors of the aircraft may be formed of one or more active composite panel assemblies. Portions of a floor within the internal cabin may be formed of one or more active composite panel assemblies 100.

Alternatively, instead of an aircraft, embodiments of the present disclosure may be used with various other vehicles, such as automobiles, buses, locomotives and train cars, watercraft, spacecraft, and the like. Further, embodiments of the present disclosure may be used with various structures, devices, components, and the like other than vehicles. For example, embodiments of the present disclosure may be used to form walls, floors, ceilings, and/or the like within fixed structures, such as residential and commercial buildings.

Figure 7:
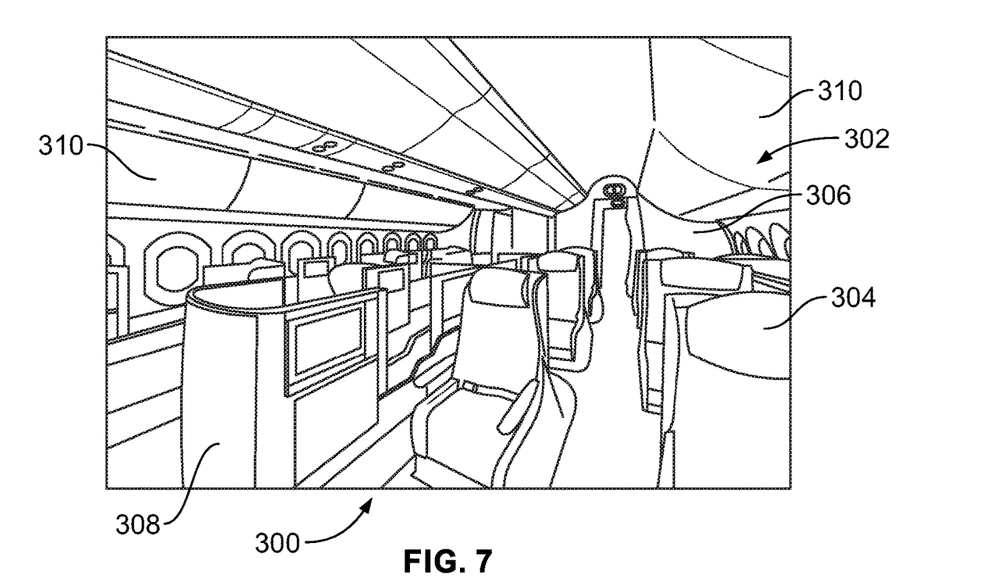
FIG. 7 is a diagrammatic representation of a passenger area within an internal cabin of an aircraft, according to an embodiment of the present disclosure.

FIG. 7 is a diagrammatic representation of a passenger area 300 within an internal cabin 302 of an aircraft, according to an embodiment of the present disclosure. The passenger area 300 may include a plurality of seats 304, walls 306, monuments 308, and the like. Overhead stowage bins 310 may be positioned over portions of the seats 304. At least portions of each of the seats 304, walls 306, monuments 308, stowage bins 310, and the like may be formed of one or more active composite panel assemblies 100 (shown in FIGS. 1-4).

Figure 8:
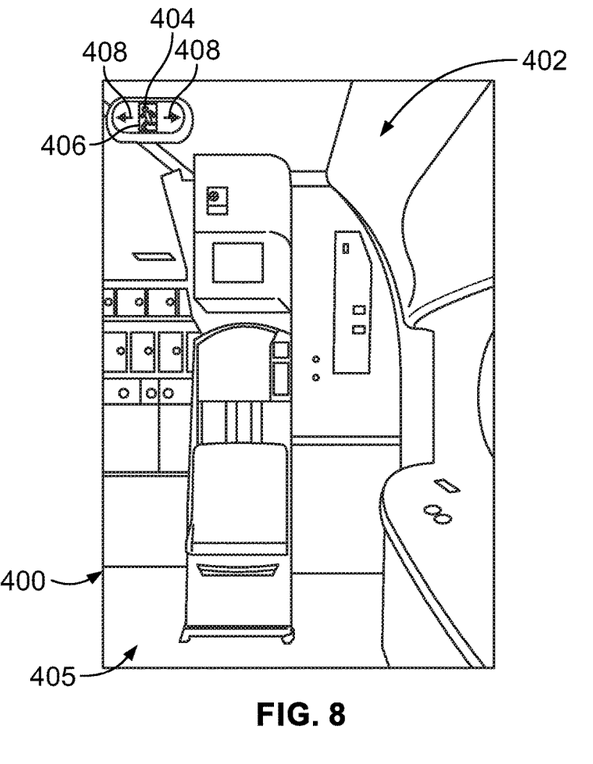
FIG. 8 is a diagrammatic representation of an attendant seating area within an internal cabin of an aircraft, according to an embodiment of the present disclosure.

FIG. 8 is a diagrammatic representation of an attendant seating area 400 within an internal cabin 402 of an aircraft, according to an embodiment of the present disclosure. An overhead exit sign 404 may be positioned above an aisle 405. The overhead exit sign 404 may be formed of one or more active composite panel assemblies 100 (shown in FIGS. 1-4). The exit sign 404 may include a graphic cover 406 having exit indicia 408. An electrical device in the form of one or more light emitting diodes may be positioned behind the graphic cover 406. The light emitting diodes may be receive power signals through one or more active layers, as described with respect to FIG. 4.

Figure 9:
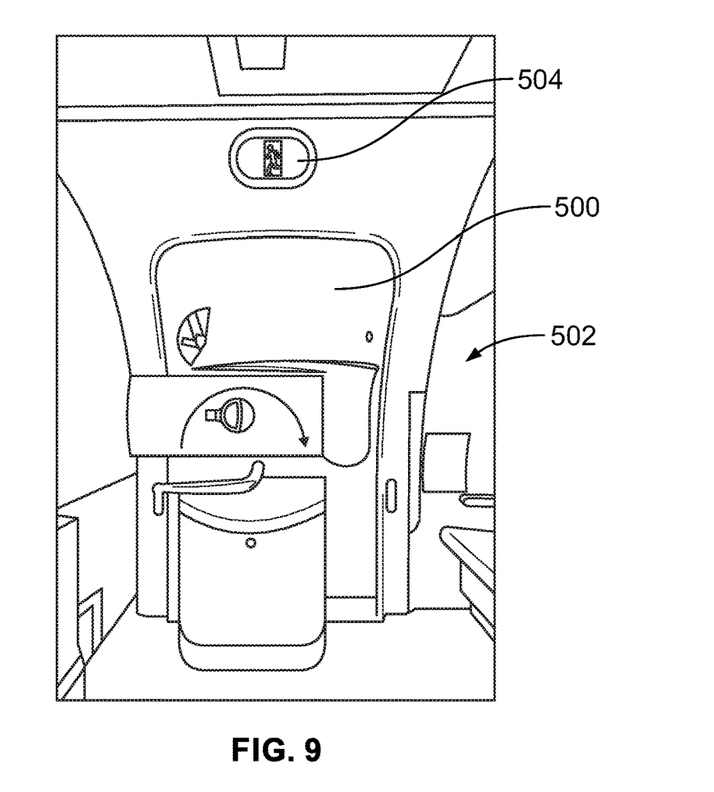
FIG. 9 is a diagrammatic representation of a door within an internal cabin of an aircraft, according to an embodiment of the present disclosure.

FIG. 9 is a diagrammatic representation of a door 500 within an internal cabin 502 of an aircraft, according to an embodiment of the present disclosure. An exit sign 504 may be formed of one or more active composite panel assemblies 100 (shown in FIG. 4).

Figure 10:
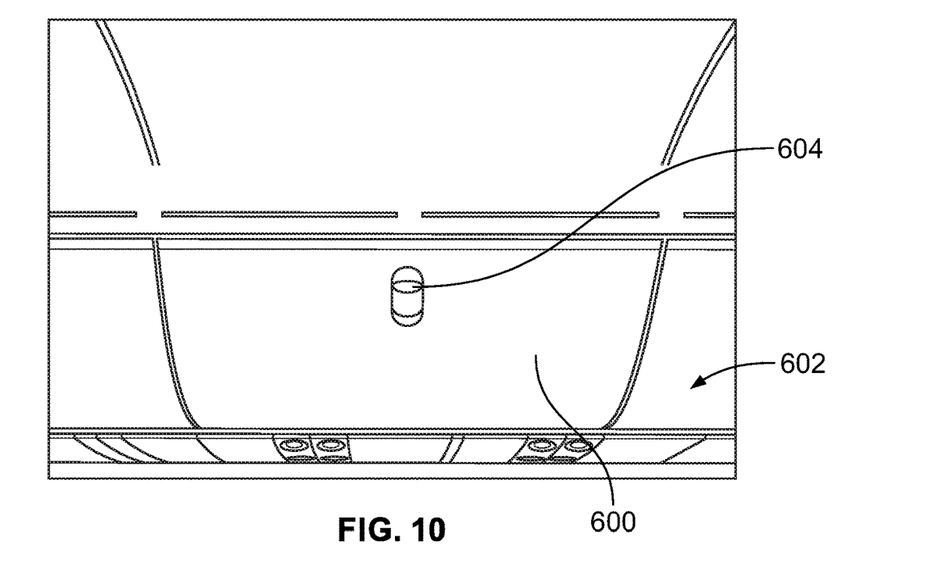
FIG. 10 is a diagrammatic representation of an overhead stowage bin within an internal cabin of an aircraft, according to an embodiment of the present disclosure.

FIG. 10 is a diagrammatic representation of an overhead stowage bin 600 within an internal cabin 602 of an aircraft, according to an embodiment of the present disclosure. The stowage bin 600 may be formed of one or more active composite panel assemblies 100 (shown in FIGS. 1-4), such that an electronic latch 604 is the electrical device.

Figure 11:
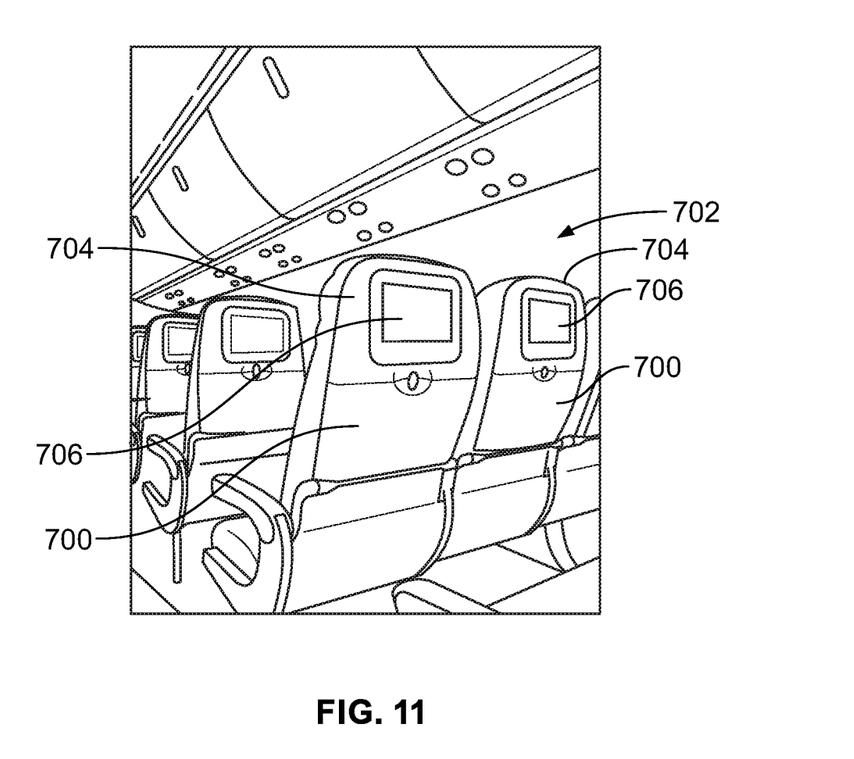
FIG. 11 is a diagrammatic aft view of passenger seats within an internal cabin of an aircraft, according to an embodiment of the present disclosure.

FIG. 11 is a diagrammatic aft view of passenger seats 700 within an internal cabin 702 of an aircraft, according to an embodiment of the present disclosure. Aft supports 704 of the seats 700 may be formed of one or more active composite panel assemblies 100 (shown in FIGS. 1-4), such that a video monitor 706 is the electrical device.

Figure 12:
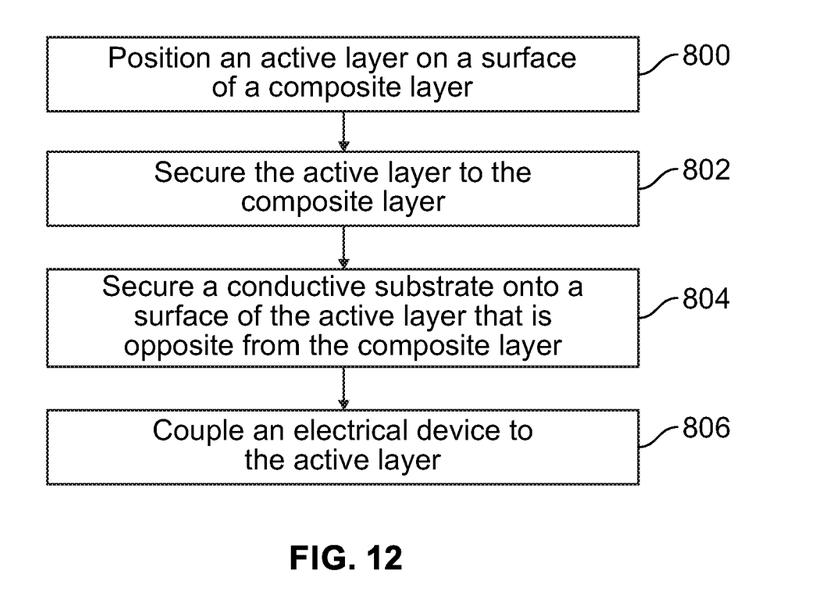
FIG. 12 illustrates a flow chart of a method of forming an active composite panel assembly, according to an embodiment of the present disclosure.

FIG. 12 illustrates a flow chart of a method of forming an active composite panel assembly, according to an embodiment of the present disclosure. The method begins at 800, in which an active layer is positioned on a surface of a composite layer. At 802, the active layer is secured to the composite layer, such as through adhesives, fasteners, and/or the like. At 804, a conductive substrate is secured onto a surface of the active layer that is opposite from the composite layer. Optionally, 804 may be omitted. At 806, an electrical device is coupled to the active layer. For example, the electrical device may be embedded within the active composite panel assembly, such as by being positioned between the active layer and a cover. In at least one other embodiment, the electrical device may be mounted onto the active composite panel assembly, or connected thereto with a cable, for example.

In at least one embodiment, the active composite panel assembly 100 may be integrally formed. For example, the components of the active composite panel assembly 100 are integrally formed together. As an example, 800, 802, 804, and 806 may occur concurrently, or have portions that occur concurrently. In at least one other embodiment, the 800, 802, 804, and 806 may occur sequentially, as shown. The active matrix layer 104, the conductive substrate 114, the laminate 120, and the like may be secured to the composite layer 102 subsequently to the composite layer 102 first being produced.

As described above, embodiments of the present disclosure provide systems and methods that efficiently connect electrical devices to a source, such as a power and/or data source. Further, embodiments of the present disclosure provide systems and methods that reduce the amount of electrical wiring and/or circuit boards within a structure or vehicle, for example.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An active composite panel assembly that is configured to transfer electrical signals from a source to an electrical device, the active composite panel assembly comprising:
   a composite layer including a core sandwiched between a first skin and a second skin, wherein the core includes a plurality of interconnected honeycomb cells, wherein one or both of the first skin and the second skin comprises at least one pre-impregnated epoxy resin layer; and
   an active layer secured to and covering an entire surface of the composite layer, wherein the active layer is entirely conductive and configured to receive and conduct the electrical signals.

2. The active composite panel assembly of claim 1, wherein the active layer comprises one or more of a conductive nano-grid, conductive nano-wires, or conductive nano-particles.

3. The active composite panel assembly of claim 1, further comprising a conductive substrate secured to the active layer opposite from the composite layer.

4. The active composite panel assembly of claim 1, further comprising a cover positioned over the active layer, wherein the cover is formed of one or more of laminate, plastic, or glass.

5. The active composite panel assembly of claim 4, wherein a channel is formed through the cover, wherein the channel is sized and shaped to receive at least a portion of the electrical device.

6. The active composite panel assembly of claim 1, further comprising the electrical device, wherein the electrical device is electrically coupled to the active layer.

7. The active composite panel assembly of claim 6, wherein the electrical device is embedded within the active composite panel assembly or mounted onto a portion of the active composite panel assembly.

8. The active composite panel assembly of claim 1, wherein the active layer includes a matrix layer that is mapped to detect resistances on a surface of the active composite panel assembly, wherein the resistances are controlled with a logic map to control transmission of the electrical signals to the electrical device.

9. The active composite panel assembly of claim 1, further comprising a signal transfer medium that extends through portions of each of the first skin, the core, and the second skin of the composite layer and couples the active layer to one or both of an electrical connector or an electrical source.

10. A method of forming an active composite panel assembly that is configured to transfer electrical signals from a source to an electrical device, the method comprising:
providing a composite layer including a core sandwiched between a first skin and a second skin, wherein the core includes a plurality of interconnected honeycomb cells, wherein one or both of the first skin and the second skin comprises at least one pre-impregnated epoxy resin layer; and
securing an active layer to and covering an entire surface of the composite layer, wherein the active layer is entirely conductive, and wherein the active layer is configured to receive and conduct the electrical signals.

11. The method of claim 10, wherein the active layer comprises one or more of a conductive nano-grid, conductive nano-wires, conductive nano-particles, conductive fibers, thin film transistors, switches, conductive films, conductive filaments, or conductive strands.

12. The method of claim 10, further comprising securing a conductive substrate to the active layer opposite from the composite layer.

13. The method of claim 10, further comprising positioning a cover over the active layer, wherein the cover is formed of one or more of laminate, plastic, or glass.

14. The method of claim 13, further comprising forming a channel through the cover, wherein the channel is sized and shaped to receive at least a portion of the electrical device.

15. The method of claim 14, further comprising:
positioning the electrical device on or in the active composite panel assembly; and
electrically coupling the electrical device to the active layer.

16. The method of claim 15, wherein the positioning operation comprises embedding the electrical device within the active composite panel assembly.

17. The method of claim 15, wherein the positioning operation comprises mounting the electrical device onto a portion of the active composite panel assembly.

18. The method of claim 10, further comprising:
positioning a signal transfer medium through portions of each of the first skin, the core, and the second skin of the composite layer;
coupling the active layer to the signal transfer medium; and
coupling the signal transfer medium to one or both of an electrical connector or an electrical source.

19. An active composite panel assembly, comprising:
a composite layer including a core sandwiched between a first skin and a second skin, wherein the core includes a plurality of interconnected honeycomb cells, wherein one or both of the first skin and the second skin comprises at least one pre-impregnated epoxy resin layer;
an active layer secured to and covering an entire surface of the composite layer, wherein the active layer is entirely conductive and configured to receive and conduct electrical signals, wherein the active layer comprises one or more of a conductive nano-grid, conductive nano-wires, conductive nano-particles, conductive fibers, thin film transistors, switches, conductive films, conductive filaments, or conductive strands;
a conductive substrate secured to the active layer opposite from the composite layer;
a cover positioned over the conductive substrate opposite from the active layer, wherein the cover is formed of one or more of laminate, plastic, or glass;
a signal transfer medium that extends through portions of each of the first skin, the core, and the second skin of the composite layer and couples the active layer to one or both of an electrical connector or an electrical source; and
an electrical device configured to receive electrical signals from the active layer through the conductive substrate.

20. The active composite panel assembly of claim 19, wherein the electrical device is positioned between the conductive substrate and the cover.

* * * * *